United States Patent
Park et al.

[11] Patent Number: 5,880,014
[45] Date of Patent: Mar. 9, 1999

[54] PLURAL WELLS STRUCTURE IN A SEMICONDUCTOR DEVICE AND METHOD FOR FORMING THE SAME

[75] Inventors: Seong Hyoung Park, Seoul; Jong Kwan Kim, Chungcheongbuk-do, both of Rep. of Korea

[73] Assignee: LG Semicon Co., Ltd., Chungcheongbuk-do, Rep. of Korea

[21] Appl. No.: 28,310

[22] Filed: Feb. 24, 1998

[30] Foreign Application Priority Data

Apr. 2, 1997 [KR] Rep. of Korea ............... 12210/1997

[51] Int. Cl.⁶ .................................................. H01L 21/265
[52] U.S. Cl. ........................................... 438/527; 438/526
[58] Field of Search .................................. 438/224, 228, 438/199, 369, 370, 372, 373, 514, 526, 527, 529, 202, 203, 227

[56] References Cited

U.S. PATENT DOCUMENTS

| | | | |
|---|---|---|---|
| 5,091,321 | 2/1992 | Huie et al. | 438/527 |
| 5,126,278 | 6/1992 | Kodaira | 438/371 |
| 5,208,168 | 5/1993 | Parillo et al. | 438/526 |
| 5,254,485 | 10/1993 | Segawa et al. | 438/370 |
| 5,389,563 | 2/1995 | Kuroi et al. | 438/526 |
| 5,436,176 | 7/1995 | Shimizu et al. | 438/527 |
| 5,478,961 | 12/1995 | Komori et al. | 438/526 |
| 5,516,718 | 5/1996 | Lee | 438/370 |
| 5,525,932 | 6/1996 | Kim | 438/526 |
| 5,536,665 | 7/1996 | Komori et al. | 438/520 |
| 5,578,507 | 11/1996 | Kuroi | 438/526 |
| 5,624,858 | 4/1997 | Terashima et al. | 438/526 |
| 5,677,209 | 10/1997 | Shon et al. | 438/370 |
| 5,716,887 | 2/1998 | Kim | 438/370 |

*Primary Examiner*—John F. Niebling
*Assistant Examiner*—S. Mulpuri

[57] ABSTRACT

Wells of a semiconductor device suitable for achieving high integration, and a method for forming the same are disclosed. The wells of a semiconductor device include a first conductivity type semiconductor substrate where a cell region and a periphery region are defined, a second conductivity type shield region in the entire cell region and in the entire periphery region at a depth below surface of the semiconductor substrate, a first conductivity type well on the second conductivity type shield region beneath the surface of the semiconductor substrate, a second conductivity type shield sidewall formed in the second conductivity type shield region and the first conductivity type well at border of the cell and periphery regions, a first conductivity type buried region formed at the second conductivity type shield region in the periphery region, and a second conductivity type well on the first conductivity type buried region in the first conductivity type well.

15 Claims, 5 Drawing Sheets

PLURAL WELLS STRUCTURE IN A SEMICONDUCTOR DEVICE AND METHOD FOR FORMING THE SAME

BACKGROUND OF THE INVENTION

1. Field of the Invention

The present invention relates to a method for fabricating a structure in a semiconductor device and, more particularly, to a plural wells structure in a semiconductor device suitable for achieving high integration, and a method for forming the same.

2. Discussion of the Related Art

In order to improve the performance of a semiconductor device, impurity ions of a conductivity type opposite to that of a substrate are first implanted into the substrate and then wells are formed.

There are various types of wells. Single well or twin well is formed by selectively or entirely implanting and diffusing ions before performing a device-isolating process. As for a diffused well, triple wells are formed. As for a retrograde well, after performing a device-isolating process, wells of different types are formed by adjusting energy of ion-implantation. A retrograde well may have a buried implanted layer for lateral isolation (BILLI) structure.

Among the aforementioned wells, a diffused well will be described. A single well or twin wells can be made to have a desired depth by controlled diffusion, which is performed vertically and horizontally. It is difficult to adjust the profile of the well. Also, the process tolerance is not tight enough.

For these reasons, triple wells are preferred to a signal well or twin wells. Nevertheless, the process for forming triple wells is complicated, making the productivity inferior. Thus, development and research has been directed to improving the productivity by simplifying the process.

A conventional method for forming wells of a semiconductor device will be described below with reference to the accompanying drawings.

FIGS. 1a to 1d are cross-sectional views showing steps of a method for forming wells of a semiconductor device. Conventional triple wells are composed of a p-type well surrounded by an n-type shield region on a cell region, and an n-type well and a p-type well for forming a CMOSFET. The triple wells isolate the p-type well in the cell region from the p-type well in a periphery region.

Referring initially to FIG. 1A, a buffer oxide layer 2 is deposited on a semiconductor substrate 1 and a 4 $\mu$m thick special photo resist film 3 is coated on the entire surface and patterned on a predetermined area by an exposure and development process. With the photo resist pattern 3 serving as a mask, n-type impurity ions are implanted to form an n-type shield region 4 at a predetermined depth below the surface of the semiconductor substrate 1.

Referring to FIG. 1B, the remaining photo resist film 3 is removed and another photo resist film 5 is coated on the entire surface, patterned by an exposure and development process and accordingly removed over a periphery portion of the n-type shield region 4 in the cell region and over a predetermined area of a periphery region, as well. With the photo resist pattern 5 serving as a mask, n-type impurity ions are implanted to form an n-type shield sidewall 6a on the periphery portion of the n-type shield region 4 in the cell region and an n-type well 6b in the periphery region. At this time, the n-type shield sidewall 6a is spaced apart from the n-type well 6b.

Referring to FIG. 1C, the remaining photo resist film 5 is removed. Then another photo resist film 7 is coated on the entire surface and patterned by an exposure and development process and accordingly removed over the n-type shield region 4 inside the n-type shield sidewall 6a and on a portion of the n-type well 6b. With the photo resist pattern 7 serving as a mask, p-type impurity ions are implanted into the semiconductor substrate 1. Thus, there are formed a first p-type well 8a in the semiconductor substrate 1 on the n-type shield region 4 and inside the n-type shield sidewall 6a and a second p-type well 8b in the semiconductor substrate 1 adjacent to the n-type well 6b.

Referring finally to FIG. 1D, the remaining photo resist film 7 is removed, thereby completing the whole process steps of forming triple wells.

The conventional method for forming wells of a semiconductor device has the following problems. First of all, mask processes are required three times and thus corresponding patterning processes and cleaning processes are also required. Three mask processes complicate the overall process and reduce the productivity. In addition, since an n-type shield region is formed deeply beneath the surface of a semiconductor substrate by high energy ion implantation, a 4 $\mu$m thick special photo resist film is required. This further complicates the process.

SUMMARY OF THE INVENTION

Therefore, the present invention is directed to a plural wells structure in a semiconductor device and a method for forming the same that substantially obviates one or more of problems due to limitations and disadvantages of the related art.

An object of the invention is to provide a plural wells structure in a semiconductor device and a method for forming the same in which the number of required masks is reduced and the occurrence of latch-up is prevented.

To achieve these and other advantages and in accordance with the purpose of the present invention, as embodied and broadly described, there is provided a plural wells structure in a semiconductor device, the structure comprising: a semiconductor substrate of a first conductivity type for which a cell region and a periphery region are defined; a shield region of a second conductivity type parallel to, and at a depth below, a surface of the semiconductor substrate throughout said cell region and said periphery region; a first well of said first conductivity type on the shield region in the semiconductor substrate; a shield sidewall of said second conductivity type formed at sides of the first well of said first conductivity type such that a bottom and said sides of said first well are shielded, a portion of said second shield sidewall being coincident with a border of the cell and periphery regions; a buried region of said first conductivity type formed so as to interrupt the shield region in the periphery region; and a well of said second conductivity type in the semiconductor substrate and on the buried region.

In another aspect of the invention, there is provided a method for forming a plural wells structure of a semiconductor device, in which triple wells are formed in a cell region and a periphery region, comprising the steps of: providing a semiconductor substrate of a first conductivity type for which a cell region and a periphery region are defined; forming a shield region of a second conductivity parallel to, and at a predetermined depth below a surface of said semiconductor substrate throughout said cell region and said periphery region; forming a shield sidewall of said second conductivity type in, on and above the shield region, a portion of said shield sidewall being coincident with a border of the cell and periphery regions; forming a buried region of said first conductivity type so as to interrupt the shield region in the periphery region; forming a first well of said first conductivity type in the semiconductor substrate and on the shield region; and forming a well of said second conductivity type on the buried region and in the semiconductor substrate.

The foregoing and other objectives of the present invention will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

These and various other objects, features, and advantages of the present invention will be readily understood with reference to the following detailed description read in conjunction with the accompanying drawings, in which.

DETAILED DESCRIPTION OF THE PREFERRED EMBODIMENTS

Reference will now be made in detail to the preferred embodiments of the present invention, examples of which are illustrated in the accompanying drawings.

Figure 1A:
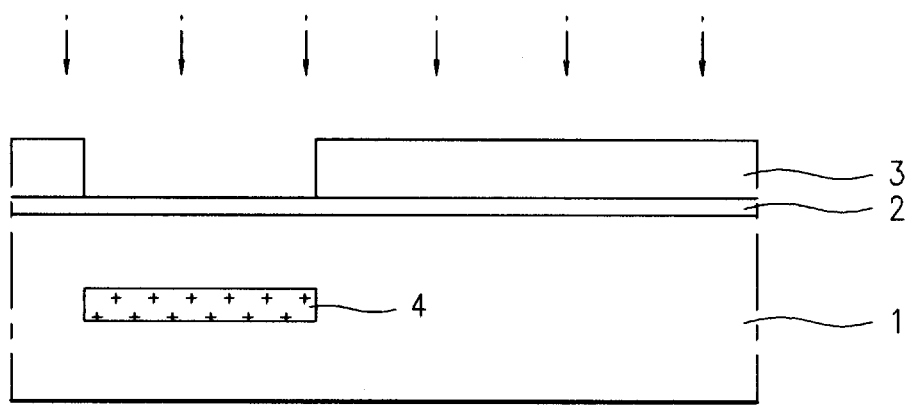
FIGS. 1a to 1d are cross-sectional views of process steps of a conventional method for forming wells of a semiconductor device.
Figure 1B:
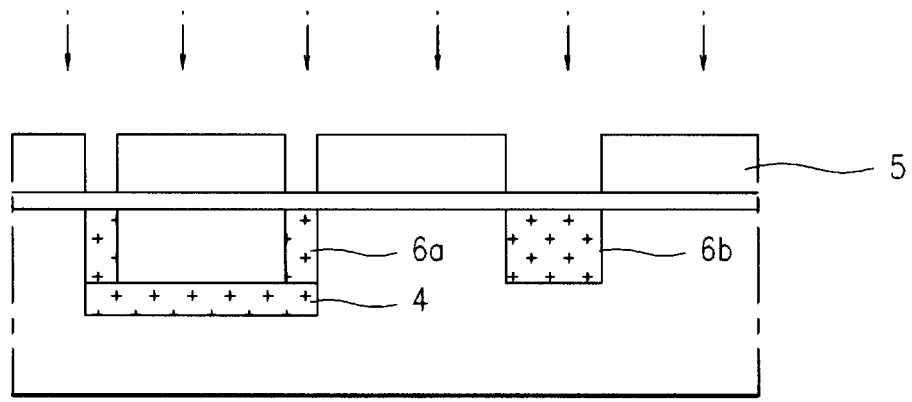
Figure 1C:
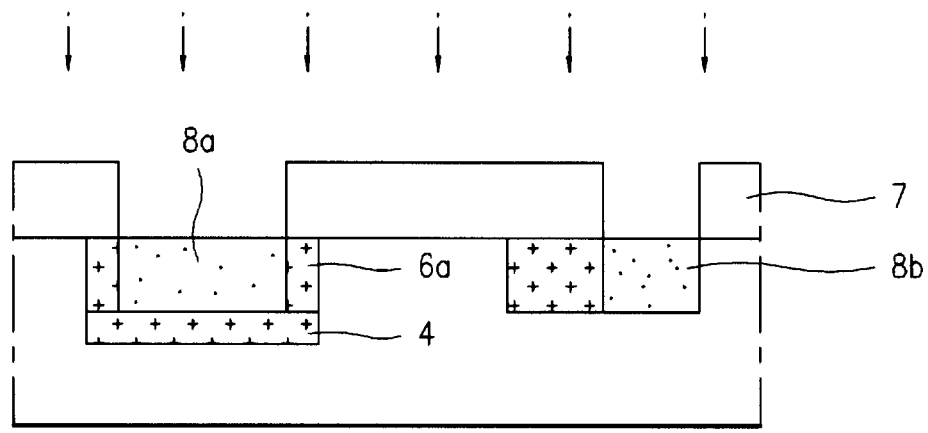
Figure 1D:
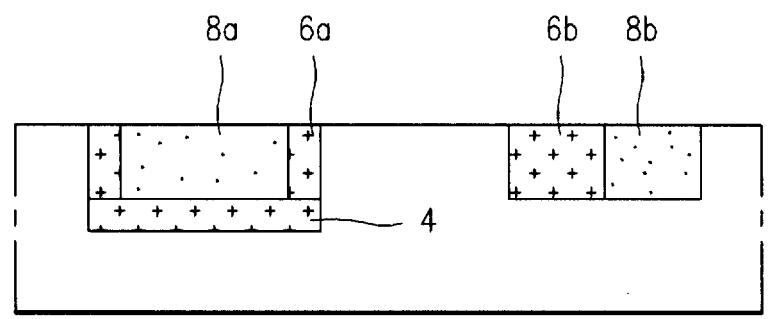
Figure 2:
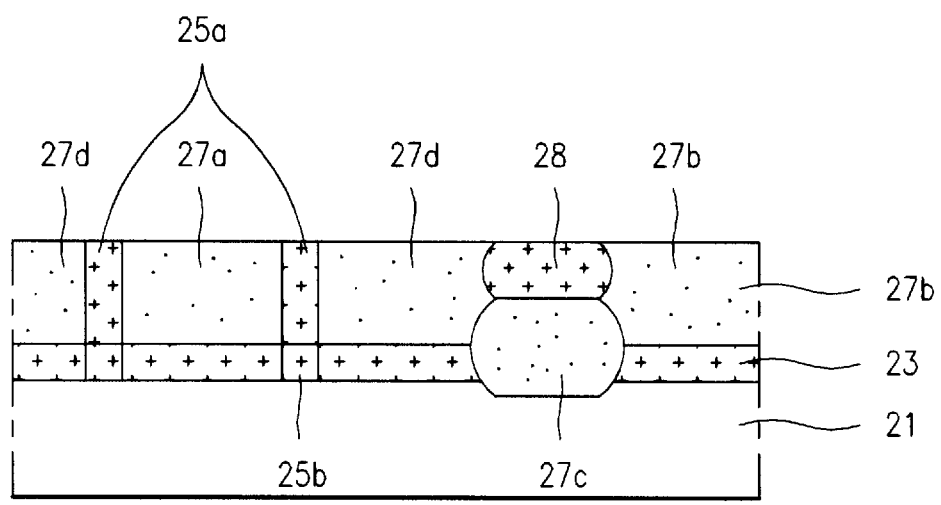
FIG. 2 illustrates wells of a semiconductor device according to the present invention.

FIG. 2 illustrates wells of a semiconductor device according to the invention and FIGS. 3A to 3D are cross-sectional views showing process steps of a method for forming wells of a semiconductor device according to a preferred embodiment of the invention.

As shown in FIG. 2, an n-type shield region 23 is formed below the surface of a semiconductor substrate 21 throughout an entire cell region and an entire periphery region defined thereon. N-type shield sidewalls 25a and 25b are formed in and on the n-type shield region 23 in the border of the cell region and the periphery region. A p-type buried region 27c is formed in, and above and below, the n-type shield region 23 and is spaced apart from the n-type shield sidewalls 25b. An n-type well 28 is formed on the p-type buried region 27c and in the semiconductor substrate 21.

If a first p-type well 27a is formed inside the n-type shield sidewall 25a on the n-type shield region 23, then a third p-type well 27d can be formed outside the n-type shield sidewall 25a on the n-type shield region 23 an in the semiconductor substrate 21. A second p-type well 27b is formed on the n-type shield region 23 and in the semiconductor substrate 21 at one side of the n-type well 28. The P-type buried region 27c is connected to both the second p-type well 27b and the third p-type well 27d which is formed between the n-type well 28 and the n-type shield sidewall 25a. The P-type buried region 27c isolates the n-type well 28 from the n-type shield region 23.

The method for fabricating wells of a semiconductor device described above will be described in detail.

Figure 3A:
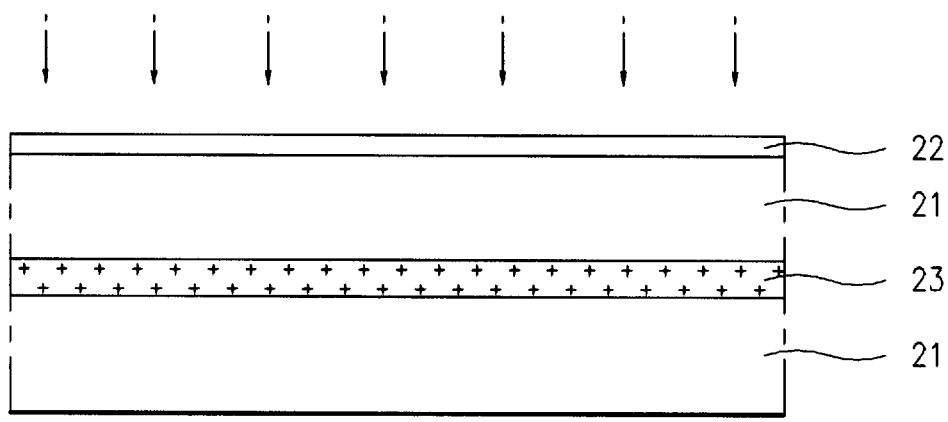
FIGS. 3a to 3d are cross-sectional views showing process steps of a method for forming wells of a semiconductor device according to a preferred embodiment of the present invention.

Referring initially to FIG. 3A, a buffer oxide layer 22 is deposited on a p-type semiconductor substrate 21. Phosphorus ions having a concentration of $2xe^{13}/cm^3$ and a high energy, that is, a projected range of 2 $\mu$m, are implanted so as to form an n-type shield region 23 at a predetermined depth below the surface of the semiconductor substrate 21.

Figure 3B:
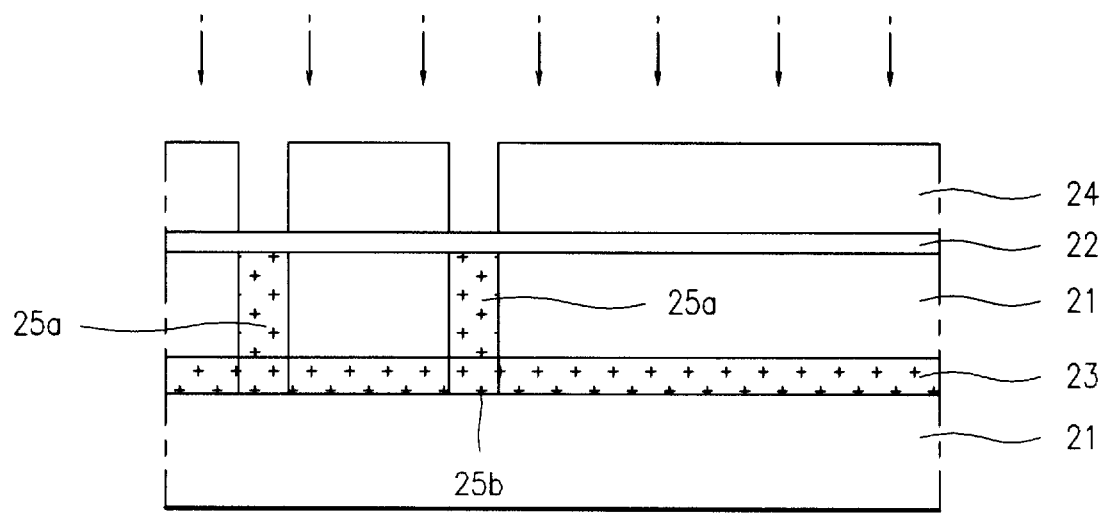

Referring to FIG. 3B, a photo resist film 24 is coated on the semiconductor substrate 21 and patterned by an exposure and development process over a predetermined area. With the photo resist pattern 24 as a mask, n-type heavily doped impurity ions are implanted to the depth of the n-type shield region 23 to form an n-type shield sidewall 25a. For the second ion implantation, the projected range is adjusted from a depth of 2 $\mu$m up to the surface and the doping concentration is $4xe^{13}/cm^3$. The portion in which the n-type shield region 23 and the n-type shield sidewall 25a overlap each other have been implanted with n-type ions twice and thus is an n-type heavily doped shield sidewall 25b. The remaining photo resist film 24 is removed.

Figure 3C:
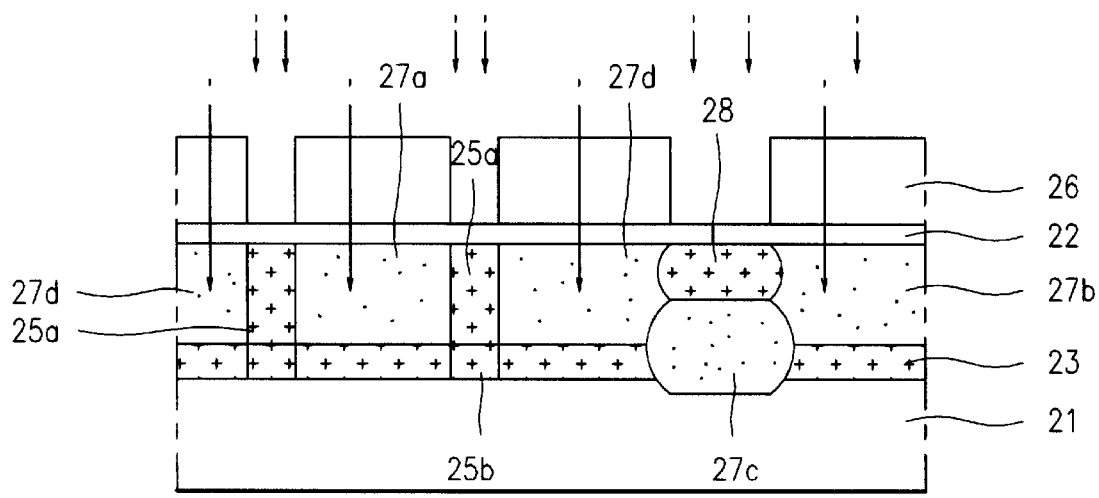

Referring to FIG. 3C, another photo resist film 26 is coated on the entire surface and patterned by an exposure and development process to be removed over the n-type shield sidewall 25a and over a predetermined area of the periphery region spaced apart from the n-type shield sidewall 25a. Using the photo resist pattern 26 as a mask, boron ions of a concentration of $3xe^{13}/cm^3$ are implanted to penetrate the photo resist film 26 with a high energy and a projected range of 1.2 $\mu$m. Accordingly, a first p-type well 27a is formed inside n-type shield sidewall 25a, on the n-type shield region 23 and in the semiconductor substrate 21. Second and third p-type wells 27b and 27d are formed outside the n-type shield sidewall 25a and in the semiconductor substrate 21. A p-type buried region 27c is formed below the exposed buffer oxide layer 22 in the periphery region an in, and above and below, the n-type shield region 23. The second p-type well 27b is formed on the n-type shield region 23 in the periphery region, in the semiconductor substrate 21. The third p-type well 27d is formed outside the n-type shield sidewall 25a. Implanting ions by penetrating a photo resist film produces a BILLI structure.

The concentration of the p-type ions implanted into the n-type shield region 23 of the periphery region is higher than the concentration of the n-type ions therein, such that the p-type buried region 27c is formed. In this case, the p-type buried region 27c is connected to the second and third p-type wells 27b and 27d.

Since the portion in which the n-type shield region 23 and the n-type shield sidewall 25a overlap each other is an n-type heavily doped sidewall 25b, it keeps its n-type although boron ions are implanted into it.

Thereafter, n-type impurity ions having a concentration of $3xe^{13}/cm^3$ are implanted with a low implanting energy having a projected range of 1 $\mu$m so as to form an n-type well 28 on the p-type buried region 27c, in the periphery region of the semiconductor substrate 21.

Figure 3D:
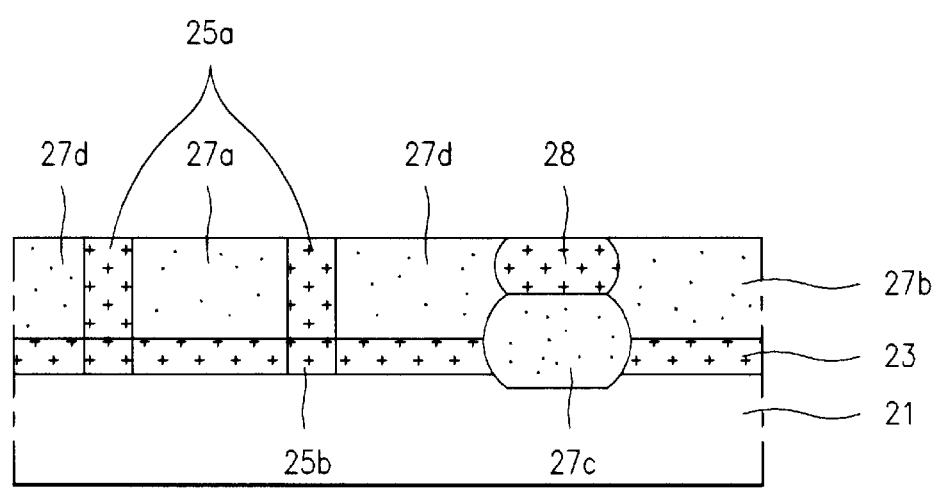

Referring finally to FIG. 3D, the remaining photo resist film 26 is removed. The first p-type well 27a is protected by the n-type shield sidewall 25a, the n-type shield region 23, and the n-type heavily doped shield sidewall 25b. The p-type buried region 27c isolates the n-type well 28 in the periphery region from the n-type shield region 23.

The substrate 21 and doped volumes 27a, 27b, 27c and 27d have been disclosed as being of p-type conductivity while the doped volumes 23, 25 and 28 have been disclosed as being of n-type conductivity. On of ordinary skill would understand that the invention includes the opposite conductivity circumstance as an alternative embodiment and that no further discussion of such an alternative is necessary.

The wells of a semiconductor device and the method for fabricating the same have the following advantages. Since triple wells are formed, the frequency of using masks is reduced by once in comparison with the conventional method. In addition, latchup can be prevented due to a p-type buried region formed in a periphery region as integration of a semiconductor device becomes higher.

It will be apparent to those skilled in the art that various modification and variations can be made in the walls and the method for forming the same of the present invention without departing from the spirit or scope of the inventions. Thus, it is intended that the present invention cover the modifications and variations of this invention provided they come within the scope of the appended claims and their equivalents.

What is claimed is:

1. A method for forming a plural wells structure of a semiconductor device, in which triple wells are formed in a cell region and a periphery region, comprising the steps of:

providing a semiconductor substrate of a first conductivity type for which a cell region and a periphery region are defined;

forming a shield region of a second conductivity parallel to, and at a predetermined depth below a surface of said semiconductor substrate throughout said cell region and said periphery region;

forming shield sidewalls of said second conductivity type in, on and above the shield region, a portion of one of said shield sidewalls being coincident with a border of the cell and periphery regions;

forming a buried region of said first conductivity type so as to interrupt the shield region in the periphery region;

forming a first well of said first conductivity type in the semiconductor substrate between said shield sidewalls and on the shield region; and forming a well of said second conductivity type on the buried region and in the semiconductor substrate;

wherein said shield region, said shield sidewalls, said buried region, said first well, and said well of said second conductivity type are formed by ion implantation.

2. The method as claimed in claim 1, wherein ion implanting is performed without using a mask to form the shield region.

3. The method as claimed in claim 1, wherein the shield region is formed by ion implanting with a projected range of 2 µm and a doping concentration of $2xe^{13}/cm^3$.

4. The method as claimed in claim 1, wherein the shield sidewall is formed by ion implanting ions over a projected range from 2 µm up to a surface of the semiconductor substrate.

5. The method as claimed in claim 1, wherein an ion doping concentration is $4xe^{13}/cm^3$ to form the shield sidewalls.

6. The method as claimed in claim 1, wherein doping concentrations to form the buried region and the first well of said first conductivity type are higher than a doping of the shield region.

7. The method as claimed in claim 1, wherein boron ions are implanted to form the buried region and the first well of said first conductivity type.

8. The method as claimed in claim 1, wherein ions to form the buried region and the first well of said first conductivity type are implanted at a projected range of 1.2 µm.

9. The method as claimed in claim 1, wherein an ion doping concentration for the buried region and the well of said first conductivity type is $3xe^{13}/cm^3$.

10. The method as claimed in claim 1, wherein an ion-implantation energy for the well of said second conductivity type is lower than an ion implantation energy for the first well of said first conductivity type.

11. The method as claimed in claim 1, wherein a projected range to form the well of said second conductivity type is 1.0 µm.

12. The method as claimed in claim 1, wherein a doping concentration to form the well of said second conductivity is about $3xe^{13}/cm^3$.

13. The method as claimed in claim 1, wherein said buried region is connected to portions of said well of said second conductivity type in said periphery region.

14. The method as claimed in claim 1, wherein said buried region is also formed above and below said shield region.

15. The method as claimed in claim 1, wherein said shield sidewalls extend down into said shield region.

* * * * *